United States Patent
Guilliard

(10) Patent No.: US 7,077,893 B2
(45) Date of Patent: Jul. 18, 2006

(54) HOOD FOR A FILTER VENTILATOR

(75) Inventor: Dietmar Guilliard, Kupferzell (DE)

(73) Assignee: STEGO-Holding GmbH, Schwäbisch Hall (DE)

( * ) Notice: Subject to any disclaimer, the term of this patent is extended or adjusted under 35 U.S.C. 154(b) by 100 days.

(21) Appl. No.: 10/399,851

(22) PCT Filed: Oct. 10, 2001

(86) PCT No.: PCT/EP01/11727

§ 371 (c)(1),
(2), (4) Date: Apr. 18, 2003

(87) PCT Pub. No.: WO02/32547

PCT Pub. Date: Apr. 25, 2002

(65) Prior Publication Data

US 2004/0098959 A1 May 27, 2004

(30) Foreign Application Priority Data

Oct. 18, 2000 (DE) ................................ 100 51 643

(51) Int. Cl.
*B01D 35/30* (2006.01)
(52) U.S. Cl. .................... 96/414; 55/359; 55/385.6; 55/422; 55/493; 454/66; 454/184
(58) Field of Classification Search ................ 55/359, 55/385.6, 422, 490, 493, 501, DIG. 36; 96/414; 454/66, 184
See application file for complete search history.

(56) References Cited

U.S. PATENT DOCUMENTS

| 3,217,629 | A | * | 11/1965 | Ekern | 126/299 D |
| 3,357,763 | A | * | 12/1967 | Toper | 312/236 |
| 4,386,948 | A | * | 6/1983 | Choksi et al. | 55/499 |
| 4,552,574 | A | * | 11/1985 | Hotta | 55/501 |
| 5,120,919 | A | | 6/1992 | Bruges | 200/289 |
| 5,213,596 | A | | 5/1993 | Kume et al. | 55/481 |
| 5,704,955 | A | * | 1/1998 | Giles | 96/26 |
| 5,766,285 | A | * | 6/1998 | Killman | 55/385.6 |
| 5,769,916 | A | | 6/1998 | Immel | 55/495 |
| 5,968,216 | A | * | 10/1999 | Powell et al. | 55/493 |
| 6,030,427 | A | * | 2/2000 | Sorice et al. | 55/480 |
| 6,110,245 | A | * | 8/2000 | Schlag et al. | 55/385.6 |
| 6,223,741 | B1 | * | 5/2001 | Panos | 126/299 E |

(Continued)

FOREIGN PATENT DOCUMENTS

DE    90 10 394.7 UI    11/1990

(Continued)

OTHER PUBLICATIONS

Patent Abstracts of Japan & JP 09 036577. "Electronic Device Cooling Dustproof Filter". Feb. 7, 1997.

*Primary Examiner*—Richard L. Chiesa
(74) *Attorney, Agent, or Firm*—Merchant & Gould P.C.

(57) ABSTRACT

The invention relates to a hood (10) for a filter ventilator, which is connected to an outside wall (40) of a space to be ventilated, in particular the outside wall (40) of a control box, circuit housing, or case for various kinds of devices, and which includes an air inlet (11), an air outlet (12), a filter (20) mounted in the air outlet and a maintenance portal (13), in particular for exchanging the filter (20). In order to enable effortless and rapid exchange of the filter, the maintenance portal (13) is made such that it can be closed by at least one pivotable flap 30.

20 Claims, 2 Drawing Sheets

U.S. PATENT DOCUMENTS 6,344,074 B1 * 2/2002 Ward et al. .................. 96/399

FOREIGN PATENT DOCUMENTS

| | | |
|---|---|---|
| DE | 40 13 645 | 5/1991 |
| DE | 93 06032.7 UI | 11/1994 |
| DE | 197 00 065 | 5/1998 |
| EP | 0 453 657 | 10/1991 |
| JP | 5-272419 * 10/1993 | .................. 55/490 |

* cited by examiner

HOOD FOR A FILTER VENTILATOR

RELATED U.S. APPLICATIONS

This application is a continuation of corresponding PCT application No. PCT/EP01/11727 filed Oct. 10, 2001 and designating the U.S.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The invention relates to a hood for a filter ventilator.

BACKGROUND OF THE INVENTION

Filter ventilators of the kind concerned here are known in the state of the art and are used primarily for ventilating the interiors of control boxes, circuit housings, and cases enclosing various other kinds of apparatus. In order to dissipate the heat generated by electronic control devices and other circuitry, a filter ventilator is used to introduce cold fresh air; this air is propelled through a hood mounted on a wall that separates the space to be ventilated from the exterior, is then passed through a filter positioned in an opening in this wall, and is finally expelled into the space that is to be ventilated by means of a blower situated behind said filter. In this process the function of the filter is to eliminate the dust in the cold air that is introduced, before it can reach the electronic components in the interior space. In particular electronic circuits in the vicinity of manufacturing and/or power-station installations are thus protected from rapid contamination by dust, which otherwise could cause short-circuiting and hence failure of the equipment, especially in humid environments. When filter ventilators are employed in very dirty surroundings, therefore, a regular exchange of the filter is essential to ensure a guaranteed cooling performance.

A customary prerequisite for the installation of a filter ventilator of this kind is that the space to be ventilated should be accessible from both the exterior and the interior. For instance, the blower situated inside the space, together with the filter, is inserted into the aperture in the wall from the interior of the space to be ventilated, and then it is fixed to the wall by operations conducted outside that space, whereas the hood positioned above it on the exterior side of the wall is mounted by means of operations on the inside. This kind of installation makes the process of exchanging the filter, which is situated between the blower and the hood, somewhat problematic; that is, at least the hood of the filter ventilator must be removed, which is an operation requiring considerable effort. Furthermore, when such activities are conducted in the interiors of control boxes, circuit housings or other cases for electronic apparatus, to ensure safety it is necessary for this apparatus to be turned off, which means that the machines and installations thereby controlled must also be inoperative during this time. For this reason, it is both laborious and expensive to exchange the filters of such a ventilator regularly.

BRIEF SUMMARY OF THE INVENTION

It is the object of the present invention to provide a hood for a filter ventilator that has been structurally designed to enable effortless and rapid exchange of the filter.

This object is achieved by a hood of a filter ventilator the present invention.

An essential point of the present invention is that the filter can be accessed from the exterior of the space to be ventilated, with no need for any temporary interruption of the function of the internal electronics. This improvement is achieved by providing a maintenance portal that is accessible from outside and can be closed by at least one hinged flap. The arrangement is such that the maintenance portal can be opened both by rotating the hood as a whole and by opening a flap that is pivotably connected to the hood. Furthermore, it is conceivable to subdivide the hood as a whole, or a flap connected to this hood, in such a way that a wing-like opening of the hood or flap segments can be undertaken on two or more sides, thus optimizing the accessibility of the filter. As an alternative for filter ventilators that are hard to reach, the opening can be closed not by a rigid flap but rather by a kind of roller shutter. Advantageously, however, a pivotably mounted hood or a flap construction pivotably mounted on the hood not only provides optimal access to the filter, but at the same time allows undisturbed flow of air from the air inlet to the filter, because there has been no or only a very slight constriction of the air channel by bearings or locking devices positioned in this region.

The hood of a filter ventilator is advantageously provided with a flap comprising retaining elements that hold the filter in the intended position when the flap is closed and release it during opening of the flap. Because as a rule the filter has a mat-like structure, suitable means must be provided to keep it in position after it has been inserted into the opening in the wall, especially if it is in a vertical orientation. In the present invention this is preferably accomplished by retaining elements connected to the flap, which press the filter into its receptacle when the flap has been closed, and thus prevent it from sliding out of place. When the flap is opened, the retaining elements are rotated away from the filter and thus make it accessible to be removed and exchanged.

Preferably, the hood of a filter ventilator is provided with a flap comprising retaining elements in the form of a wire framework matched to the dimensions of the filter. This framework allows the pressure applied to the surface of the filter to be uniform over its entire length, which in turn preserves the shape of the filter and keeps the filter reliably in the desired position within the opening leading to the interior space. Furthermore, the wire of which such a framework is made can be shaped and mounted with very little effort and expense. And because such a framework occupies a small cross-sectional area of the opening, it presents essentially no obstacle to the flow of air through the channel between air inlet and filter, as a result of which it does not impair the cooling performance of the filter ventilator.

An especially simple structural solution to the problem of fixing the filter in the intended position is provided when the retaining elements are fixedly connected to the flap. In this case opening of the flap leaves the filter completely free, so that it can be exchanged, and when the flap is closed, the new filter is fixed in position.

However, the retaining elements can also advantageously be flexibly connected to the flap by spring devices. The result is that when the flap is opened, the filter is not completely freed by the rotation of the retaining elements; instead, it continues to be fixed in its position by the retaining elements elastically connected to the flap, but the pressure exerted by these elements is less than when the flap is closed. Hence at this moment the filter cannot slide out of its intended position and thus, potentially, fall into the interior of the hood. It is only after the spring-mounted retaining elements have been pressed or pulled away by hand that the filter can be exchanged. A similar effect is achieved during closure: as the flap is being closed, the new filter is kept in position even before the closing process has been completed. By employing such spring connections between flap and retaining elements it can be ensured that after the flap has been completely closed, the filter is fixed in precisely the position in which it was inserted. Not until the flap is closed is the ultimately desired pressure exerted by the retaining elements against the filter. As a result of such variation of the applied pressure, depending on the opening angle of the flap, it becomes particularly easy to carry out an exchange of filters. Despite these obvious advantages, it is of course also conceivable for the sake of simplicity to install the elastic retaining elements so that they are not directly connected to the flap but are mounted at another place on the inside of the hood of a filter ventilator, or on the ventilator itself.

To make sure that a filter ventilator functions faultlessly, i.e. is guaranteed to provide cold air from outside in order to cool electronic components in the internal space that is to be ventilated, the flap is preferably such that it can be locked to the hood. This measure ensures that, in particular in a manufacturing environment, the flap cannot be dislodged from its closed position by impacts or vibrations.

In public buildings the flap is advantageously so configured that it can be fixed to the hood by a key-operated lock. Hence only the maintenance personnel will be able to undertake operations involving the filter ventilator.

In surroundings to which the general public are not admitted, the flap can advantageously be kept in the closed position with respect to the hood by means of at least one magnetic contact. A first consideration is that this facilitates access to the filter; secondly, it is a simpler and more economical means of keeping the flap closed.

Preferably the flap is provided on an upper surface with a handle and/or a recess that can be grasped to facilitate opening. Structures of this kind make manipulation of the flap considerably easier during maintenance operations.

The flap can advantageously be constructed in a substantially rectangular form. Such a shape offers the advantage that the maintenance portal can be made correspondingly large, and at the same time the flap can be mounted by simple means at one of its long sides. On the other hand, if the apparatus is installed in public buildings or control centers of large operations where it is important for it to fit into a particular overall design, it is of course also conceivable to deviate from the substantially rectangular form of the flap, possibly even sacrificing functionality, in favor of another shape such as triangular.

So that the maintenance portal can be closed in an essentially airtight manner, it is advantageous for the flap and/or the maintenance portal to comprise sealing elements at the edges. This measure ensures in particular that cold air sucked in from the exterior is conducted only through the air inlet of the hood prior to entering the space that is to be ventilated. For instance, the hood's air inlet may be aimed at a preferred region from which air is to be taken in, and such seals prevent other, possibly warmer air from flowing past the flap that covers the maintenance portal. This feature can be crucial in particular when the hood of the filter ventilator is mounted near the top of a wall that separates the space to be ventilated from the exterior, and the air inlet to the ventilator is aimed downward.

Preferably the sealing elements of a hood of a filter ventilator consist of a spring-and-groove joint. The components that engage one another in this way ensure, e.g. also in combination with an inserted rubber seal, that the maintenance portal will be sealed against the flap in a simple and secure manner (even with respect to EMC).

In the following, the invention is described with reference to an exemplary embodiment, the explanation of which is assisted by the attached drawings.

DETAILED DESCRIPTION OF THE INVENTION

Figure 1:
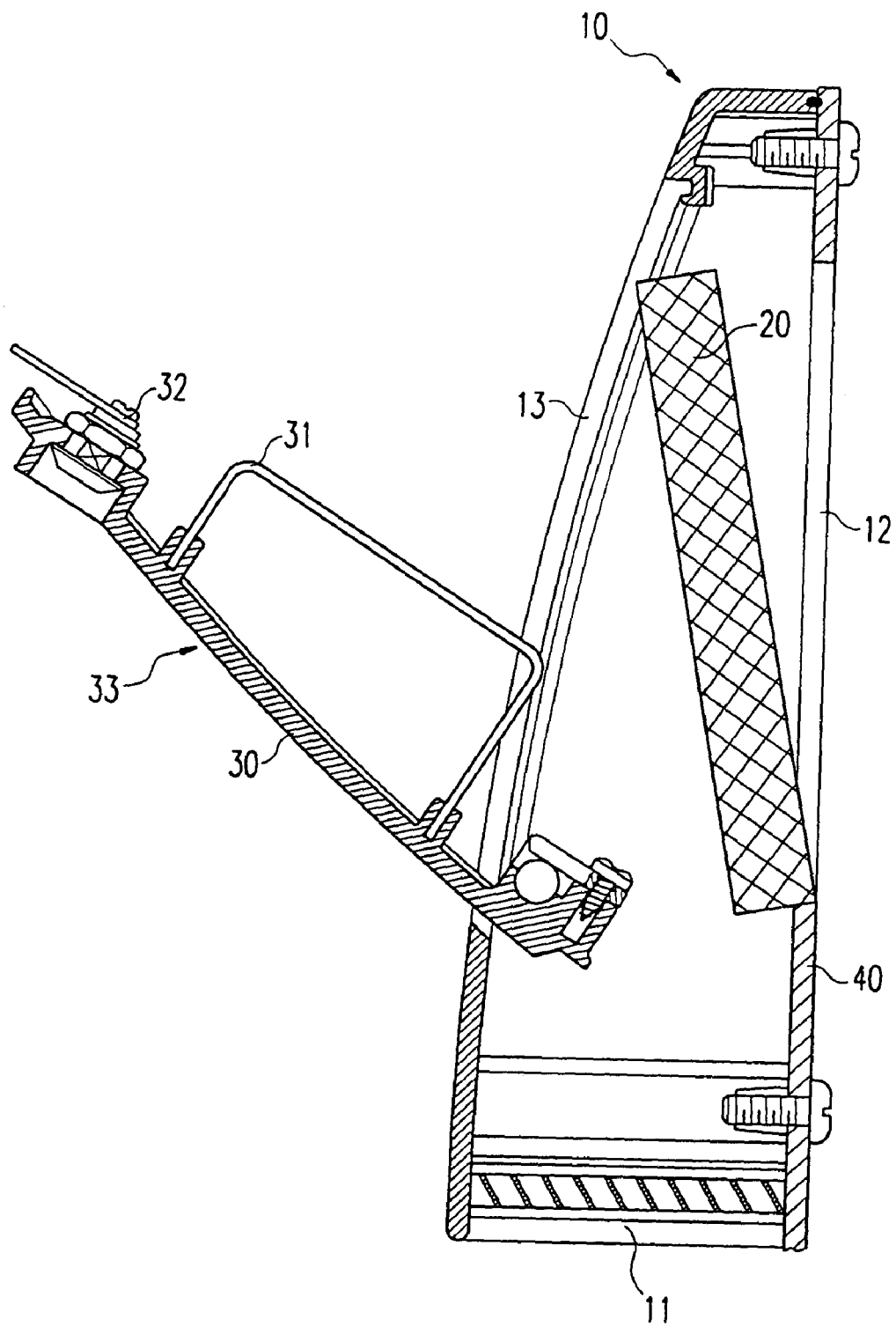
FIG. 1 is a sectional side view through a hood (10) of a filter ventilator with opened flap (30)

In the following description, for identical parts or parts with identical actions the same reference numerals are used, although for reasons of clarity these are not all shown in each of the figures.

FIG. 1 is a side view in section of a hood (10) of a filter ventilator with opened flap (30), which in this position leaves the maintenance portal (13) free so that it is possible to exchange the filter (20), which here is shown partially disengaged from the air-outlet opening (12). The hood (10) itself is attached to the exterior wall (40) of a control box, circuit housing or case for various kinds of equipment, by means of screws inserted from the interior space, and comprises an air inlet (11) through which the cold air intended for cooling is sucked from outside. This entering air then flows along the internal profile of the hood (10) and finally passes through the filter (20), behind which as a rule a blower (not shown here) is disposed in the space that is to be ventilated. In the upper surface (33) of the flap (30) a handle or recess that can be grasped can optionally be disposed; however, in the present case a key-operated lock (32) is provided, so that there is no need for a handle with which to open the flap. The retaining elements 31—only one of which is visible here, because this is a sectional side view—are swiveled away from the filter 20 when the flap 30 is opened, leaving the filter 20 free to be exchanged. This arrangement makes it possible for the filter 20 to be readily accessed from the outside of the space to be ventilated, and simultaneously ensures reliable fixation of the filter 20 in the desired position.

Figure 2:
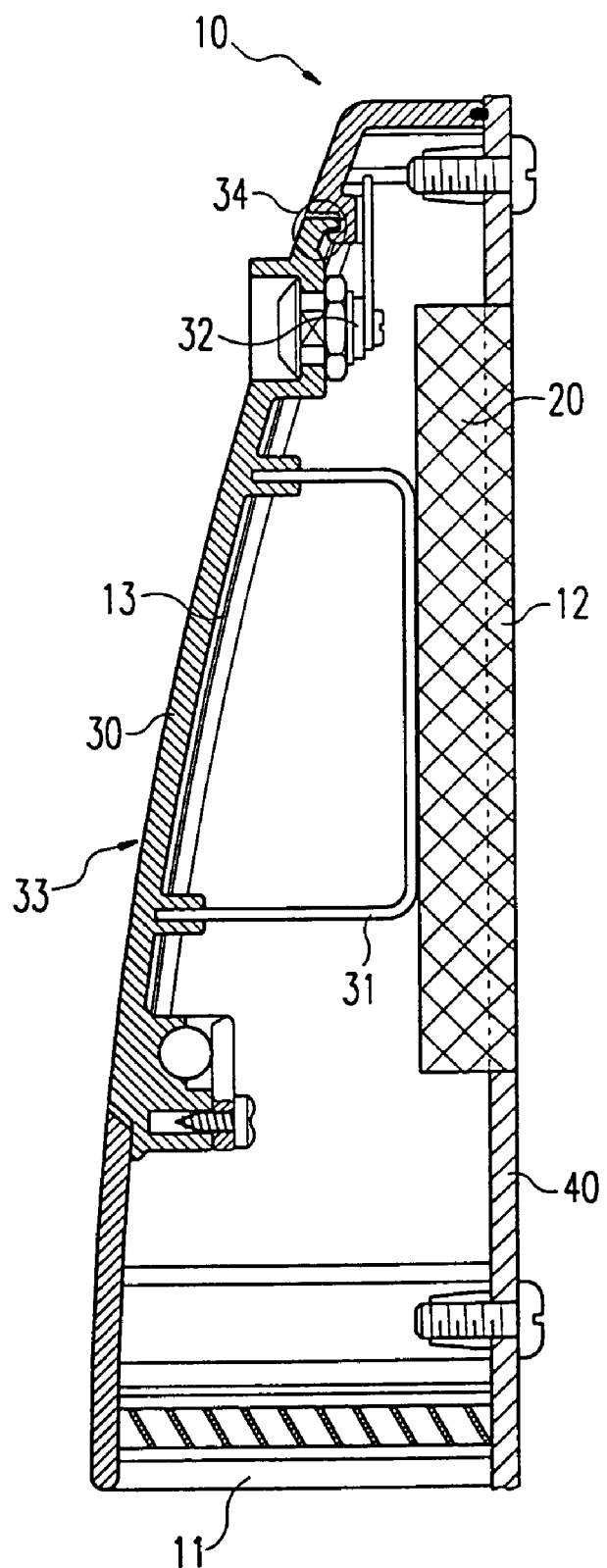
FIG. 2 is a sectional side view through the hood (10) of the filter ventilator shown in FIG. 1 with the flap (30) closed.

FIG. 2 is a sectional side view of the hood 10 shown in FIG. 1, in which the flap 30 has been closed, so that the stirrup-shaped retaining elements 31 are now pressing the filter 20 securely into the air outlet 12 through which air passes from the hood 10 into the space to be ventilated. The flap 30 is locked into place against the hood 10 by means of the key-operated lock 32, so that it is securely retained in the closed position as desired and can be opened only by maintenance personnel in possession of the key. When the flap 30 is in this closed position, the sealing elements 34, which consist of a groove-and-spring combination, are engaged with one another and thus ensure an airtight closure of the maintenance portal.

The procedure illustrated in FIGS. 1 and 2 for exchanging the filter 20 of the hood 10 of a filter ventilator demonstrates the advantages of the present invention in two ways. First, it is now possible to exchange the filter from outside the space that is being ventilated, by reaching through a hinged flap 30, with little effort and no need to turn off the electronics for a long time. Furthermore, the provision of retaining elements 31 allows the filter 20 to be fixed securely in the intended position after the flap 30 has been closed. Corresponding sealing elements 34 simultaneously produce an airtight closure of the maintenance portal 13, to ensure that cold air will enter the hood through the air inlet 11.

| List of reference numerals | |
|---|---|
| 10 | Hood |
| 11 | Air inlet |
| 12 | Air outlet |
| 13 | Maintenance portal |
| 20 | Filter |
| 30 | Flap |
| 31 | Retaining elements |
| 32 | Lock |
| 33 | Upper side |
| 34 | Sealing elements |
| 40 | Outside wall |

The invention claimed is:

1. A hood for a filter ventilator for connection to an outside wall of a control box or a cutout cabinet, said hood comprising:
   an air inlet;
   an air outlet; and
   a filter mounted between the air inlet and the air outlet; wherein
   said hood is provided as a separate component for being mounted to said filter ventilator, said hood comprising a maintenance portal for inserting and removing said filter, said portal being located opposite to the air outlet and said hood further comprising a flap pivotably connected to said hood for closing said maintenance portal.

2. The hood for a filter ventilator according to claim 1, wherein the flap is pivotably connected to the hood.

3. The hood for a filter ventilator according to claim 1, wherein the flap comprises retaining elements that fix the filter in the intended position when the flap is closed, and expose the filter so that it can be exchanged when the flap is open.

4. The hood for a filter ventilator according to claim 3, wherein the retaining elements are stirrup-shaped.

5. The hood for a filter ventilator according to claim 3, wherein the retaining elements are fixedly connected to the flap.

6. The hood for a filter ventilator according to claim 3, wherein the retaining elements have a flexible, spring-type connection to the flap.

7. The hood for a filter ventilator according to claim 1, wherein the flap can be locked to the hood.

8. The hood for a filter ventilator according to claim 7, wherein the flap can be locked to the hood by a key-operated lock.

9. The hood for a filter ventilator according to claim 1, wherein the flap can be kept in the closed position against the hood by means of at least one magnetic contact.

10. The hood for a filter ventilator according to claim 1, wherein the flap is provided on its upper side with a handle or a recess that can be grasped to facilitate opening.

11. The hood for a filter ventilator according to claim 1, wherein the flap has a substantially rectangular shape.

12. The hood for a filter ventilator according to claim 1, wherein the edges of at least one of the flap and the maintenance portal comprise sealing elements so that the maintenance portal can be closed in a substantially airtight manner.

13. The hood for a filter ventilator according to claim 12, wherein the sealing elements comprise a groove-and-spring combination.

14. A filter ventilator hood for use on an outside wall of a control box, circuit housing or case to cool electronic control devices and other circuitry located within the control box, circuit housing or case, said hood comprises:
   an air inlet,
   an air outlet,
   a filter,
      wherein said filter is mounted in the air outlet,
   a maintenance portal,
      wherein said portal is located directly opposite the air outlet,
   a flap,
      wherein said flap is pivotably connected to said hood for closing said maintenance portal, and
   wherein said hood is configured to be connected to the wall, wherein the wall has an opening.

15. The hood according to claim 14, wherein the flap comprises retaining elements that fix the filter in the intended position when the flap is closed, and expose the filter so that it can be exchanged when the flap is open.

16. The hood according to claim 15, wherein the retaining elements are stirrup-shaped and fixedly connected to the flap.

17. The hood for a filter ventilator according to claim 15, wherein the retaining elements have a flexible, spring-type connection to the flap.

18. The hood according to claim 14, wherein the flap has a substantially rectangular shape.

19. The hood according to claim 14, wherein the edges of at least one of the flap and the maintenance portal comprise sealing elements so that the maintenance portal can be closed in a substantially airtight manner.

20. The hood according to claim 19, wherein the sealing elements comprise a groove-and-spring combination.

* * * * *